United States Patent [19]
Ishii

[11] Patent Number: 5,835,988
[45] Date of Patent: Nov. 10, 1998

[54] PACKED SEMICONDUCTOR DEVICE WITH WRAP AROUND EXTERNAL LEADS

[75] Inventor: Hideki Ishii, Tokyo, Japan

[73] Assignee: Mitsubishi Denki Kabushiki Kaisha, Tokyo, Japan

[21] Appl. No.: 736,405

[22] Filed: Oct. 24, 1996

[30] Foreign Application Priority Data

Mar. 27, 1996 [JP] Japan ................................ 8-072414

[51] Int. Cl.⁶ .......................... H01L 23/06; H01L 23/02; H01L 23/48
[52] U.S. Cl. .......................... 257/684; 257/666; 257/685; 257/686; 257/696; 438/124; 438/126
[58] Field of Search .......................... 257/666, 684–686, 257/696; 438/124–126

[56] References Cited

U.S. PATENT DOCUMENTS

| | | | |
|---|---|---|---|
| 4,985,749 | 1/1991 | Berneur et al. | 257/735 |
| 5,554,886 | 9/1996 | Song | 257/666 |
| 5,581,118 | 12/1996 | Mays | 257/666 |
| 5,600,179 | 2/1997 | Suzuki | 257/690 |
| 5,602,420 | 2/1997 | Ogata et al. | 257/686 |
| 5,656,856 | 8/1997 | Kweon | 257/686 |

FOREIGN PATENT DOCUMENTS

| | | | |
|---|---|---|---|
| 4400341 | 7/1994 | Germany | 257/696 |
| 58-164248 | 9/1983 | Japan . | |
| 2310957 | 12/1990 | Japan . | |
| 4225545 | 8/1992 | Japan . | |
| 5190743 | 7/1993 | Japan . | |

Primary Examiner—Mahshid D. Saadat
Assistant Examiner—Allan R. Wilson
Attorney, Agent, or Firm—Leydig, Voit & Mayer, Ltd.

[57] ABSTRACT

A semiconductor device with reduced thickness, improved heat radiation, and a stacked structure. Molded resin covers an IC chip wire and part of a die pad. The die pad is exposed from the molded resin. An external lead in the same plane as the exposed surface of the die pad extends to a side of the resin opposite the die pad and along the molded resin. This structure allows a reduction in thickness of the semiconductor device, the exposed die pad improves heat radiation, and the external lead on upper and lower surfaces of the resin allows the semiconductor devices to be stacked.

9 Claims, 9 Drawing Sheets

PACKED SEMICONDUCTOR DEVICE WITH WRAP AROUND EXTERNAL LEADS

BACKGROUND OF THE INVENTION

1. Field of the Invention

The present invention relates to a sealed IC package and a method of manufacturing the same, and particularly to a semiconductor device having reduced thickness, improved heat radiation, and a structure and a method of manufacturing the same.

2. Description of the Background Art

FIG. 18 is a sectional view of a conventional semiconductor device. In FIG. 18, 1 denotes an IC (semiconductor integrated circuit) chip, 2 denotes a wire, 3a denotes a die pad, 4a denotes an external lead electrically connected to the IC chip 1 through the wire 2 for making external connection with a substrate or the like, and 5a denotes a molded resin.

The conventional semiconductor device shown in FIG. 18 has the following problems I to III.

I. Since the external lead 4a for making external connection to a substrate or the like is disposed below the position of the die pad 3a, it is difficult to reduce the thickness of the semiconductor device.

II. Since the die pad 3a is provided inside the IC package body (molded resin 5a), its heat radiating property is inferior.

III. Since the external lead 4a for making external connection with a substrate or the like is disposed only in one direction below the semiconductor device, it is difficult to stack the semiconductor devices.

SUMMARY OF THE INVENTION

According to a first aspect of the present invention, a semiconductor device comprises: a semiconductor integrated circuit chip; a connection plate on which one main surface the semiconductor integrated circuit chip is mounted; and a semiconductor device package body covering the semiconductor integrated circuit chip and the one main surface of the connection plate; wherein the other main surface of the connection plate is exposed from the package body.

Preferably, according to a second aspect, the semiconductor device further comprises an external terminal electrically connected to the semiconductor integrated circuit chip and formed from the same plane as the other main surface of the connection plate to a surface side of the package body on the opposite side to the other main surface.

Preferably, according to a third aspect, in the semiconductor device, a part of the external terminal which is formed on the surface side of the package body and the surface of the package body are the same plane.

Preferably, according to a fourth aspect, the semiconductor device further comprises a protecting material covering the external terminal except in its portion for connection to the outside.

Preferably, according to a fifth aspect, the semiconductor device further comprises a connecting material formed in a portion for connection to the outside of the external terminal for electrically connecting the external terminal and the outside.

Preferably, according to a sixth aspect, in the semiconductor device, the external terminal has a enlarged portion in a connection to the outside.

Preferably, according to a seventh aspect, in the semiconductor device, the external terminal includes a plurality of external terminals, each of the external terminals having a enlarged portion in a connection to the outside, the respective enlarged portions being arranged in a stagger.

Preferably, according to an eighth aspect, the semiconductor device further comprises a dummy terminal which is not electrically connected to the semiconductor integrated circuit chip.

A ninth aspect of the present invention relates to a semiconductor device comprising a plurality of semiconductor devices each as recited in the second aspect, wherein the plurality of semicondutor devices are stacked with their respective external terminals electrically connected.

Preferably, according to a tenth aspect, the semiconductor device further comprises a frame for connecting the plurality of semiconductor devices.

According to an eleventh aspect, a method of manufacturing a semiconductor device comprises the steps of: preparing an external terminal on the same plane as a connection plate mounting a semiconductor integrated circuit chip on a surface of the connection plate; electrically connecting the semiconductor integrated circuit chip and the external terminal; forming a semiconductor device package body covering the surface side of the connection plate and a part of the external terminal on the same side; and bending the external terminal along the package body onto the surface side of the package body.

According to the first aspect of the present invention, since the other main surface of the connection plate is exposed from the package body, the heat radiating property is improved.

According to the second aspect of the present invention, since the connection plate and the connection part of the external terminal connected to the outside are formed in the same plane, the thickness of the semiconductor device can be reduced. Furthermore, since the external terminal is formed from the same plane as the other main surface of the connection plate to the surface side of the package body on the side opposite to the other main surface, the semiconductor devices can be placed on top of another.

The third aspect of the present invention prevents the external terminal from curving in the outward direction of the package body and allows application of the common screen printing method when supplying a connecting material to the connection of the external terminal to the outside.

According to the fourth aspect of the present invention, the connecting material for making connection to an external substrate or the like is prevented from flowing into the gap between the connection plate and the external terminal.

According to the fifth aspect of the present invention, the formation of the connecting material for connection with an external substrate or the like on the external terminal enables connection to the external substrate or the like without requiring supply of a connecting material in mounting.

According to the sixth aspect of the present invention, the external terminal having the enlarged portion in the external connection part absorbs shift of the semiconductor device in mounting and provides sufficient connection of the connecting material when mounting.

According to the seventh aspect of the present invention, the staggered arrangement of the enlarged portions enlarges the distance between the enlarged portion of one external terminal and the other adjacent external terminal and remedies bridging of solder.

According to the eighth aspect of the present invention, when the semiconductor devices according to the second aspect having the dummy terminal are stacked into multiple layers, electric connection between external terminals which should not be connected can be prevented.

According to the ninth aspect of the present invention, stacking the semiconductor devices of the second aspect into multiple layers allows a reduction of packaging area, higher packaging density and larger capacity.

According to the tenth aspect of the present invention, connecting the semiconductor devices using the frame suppresses positional shift of the semiconductor devices when stacked.

According to the eleventh aspect of the present invention, the semiconductor device of the second aspect can be obtained.

The present invention has been made to solve the problems of the conventional semiconductor device and it is an object to obtain a semiconductor device enabling the reduction in thickness, the improvement of heat radiating property, and the realization of stacked structure of the semiconductor device and a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10(*a*) is a sectional view of a semiconductor device according to a sixth preferred embodiment of the present invention and FIG. 10(*b*) is an enlarged view of the connections of the external leads for making external connection with a substrate or the like.

FIG. 11(*a*) is a sectional view of a semiconductor device according to a seventh preferred embodiment of the present invention and FIG. 11(*b*) is an enlarged view of the connections of the external leads for external connection to a substrate or the like.

DESCRIPTION OF THE PREFERRED EMBODIMENTS

First Preferred Embodiment

Figure 1:
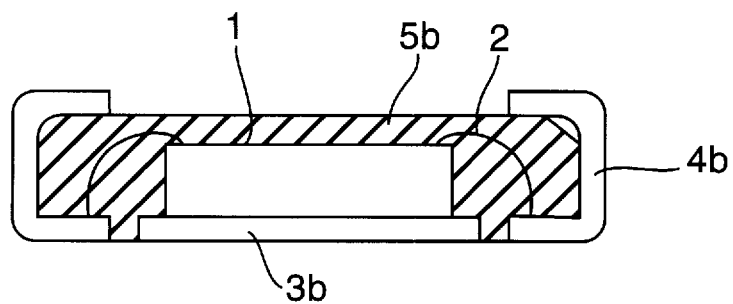
FIG. 1 is a sectional view of a semiconductor device according to a first preferred embodiment of the present invention.

FIG. 1 is a sectional view of a semiconductor device according to a first preferred embodiment of the present invention. In this figure, 1 denotes an IC (semiconductor integrated circuit) chip, 2 denotes a wire, 3*b* denotes a die pad serving as a connection plate on which the IC chip 1 is mounted, 4*b* denotes an external lead (external terminal) electrically connected to the IC chip 1 through the wire 2 for making external connection to a substrate or the like, and 5*b* denotes molded resin which is a body of the IC package.

Next, the structure of the semiconductor device in this preferred embodiment will be described. The IC chip 1 is connected to the die pad 3*b*. The molded resin 5*b* covers the IC chip 1, the wire 2 and the die pad 3*b*. The back (the lower side in the diagram) of the die pad 3*b* is exposed from the molded resin 5*b*. The external leads 4*b* are electrically connected to the IC chip 1 through the wires 2 and extend from the same plane as the die pad 3*b* along the side wall of the molded resin 5*b* onto the surface side of the molded resin 5*b* on the opposite side to the die pad 3*b* (the upper side in the diagram). When it is mounted with an external substrate, or the like (not shown), the external leads 4*b* are connected to the external substrate or the like.

Figure 2:
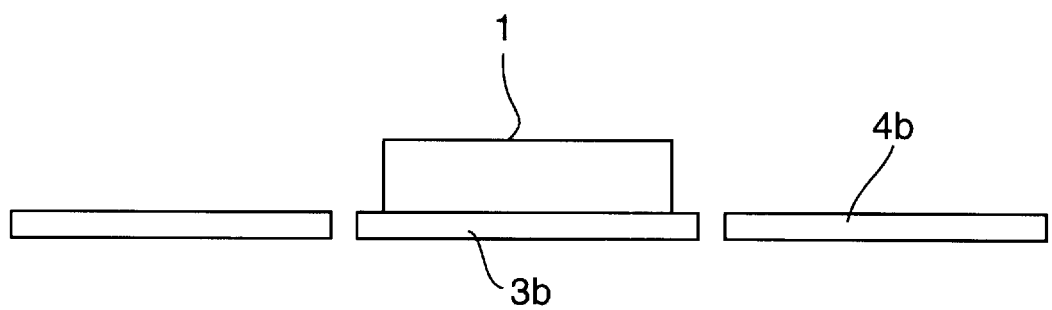
FIG. 2 is a diagram showing a method of manufacturing the semiconductor device according to the first preferred embodiment of the present invention.
Figure 3:
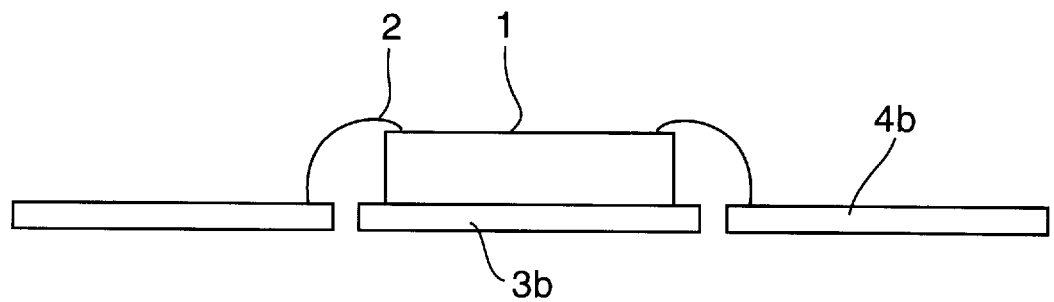
FIG. 3 is a diagram showing a method of manufacturing the semiconductor device according to the first preferred embodiment of the present invention.
Figure 4:
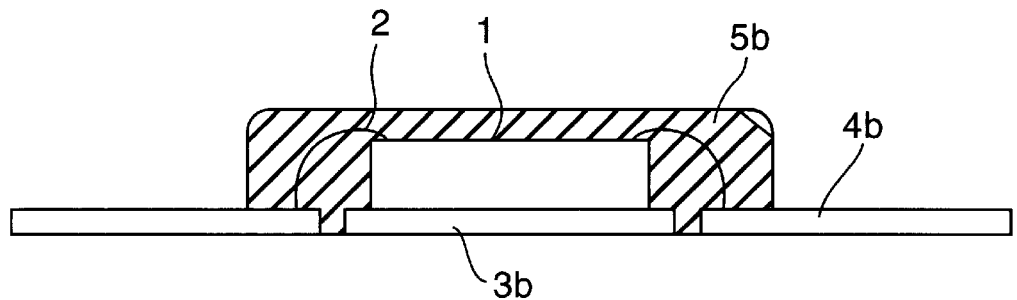
FIG. 4 is a diagram showing a method of manufacturing the semiconductor device according to the first preferred embodiment of the present invention.
Figure 5:
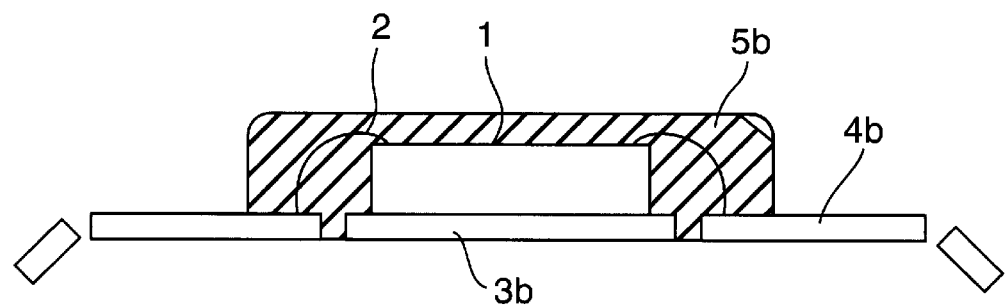
FIG. 5 is a diagram showing a method of manufacturing the semiconductor device according to the first preferred embodiment of the present invention.

Next, a method of manufacturing the semiconductor device shown in FIG. 1 will be described. First, referring to FIG. 2, the external leads 4*b* are prepared in the same plane as the die pad 3*b* and the IC chip 1 is connected to the surface of the die pad 3*b* (the upper side in the drawing). (Die bond) Next, referring to FIG. 3, the wires 2 are formed for electrically connecting the IC chip 1 and the external leads 4*b*. (Wire bond) Next, referring to FIG. 4, the resin 5*b* covering the surface side of the die pad 3*b* and the portions of the external leads 4*b* on the surface side of the die pad 3*b* is molded to cover the IC chip 1 and the wires 2. (Resin formation) Next, referring to FIG. 5, the external leads 4*b* are cut to a required length. (Lead cutting) Next, the external leads 4*b* are bent along the molded resin 5*b* so that they extend from the back of the die pad 3*b* to the surface side of the molded resin 5*b* on the opposite side (Lead bend) and then the semiconductor device shown in FIG. 1 is completed.

The semiconductor device of this preferred embodiment provides the following effects; (1) Since the die pad 3b and the connections of the external leads 4b connected to an external substrate or the like are in the same plane, the thickness of the semiconductor device is reduced. (2) Since the die pad 3b is exposed from the molded resin 5b, heat radiation is improved. And, (3) Since the external leads 4b are formed on the upper and lower sides of the semiconductor device (on the surface side of the molded resin 5b and the exposed surface side of the die pad 3b) along the molded resin 5b, it is possible to stack the semiconductor devices.

Second Preferred Embodiment

Figure 6:
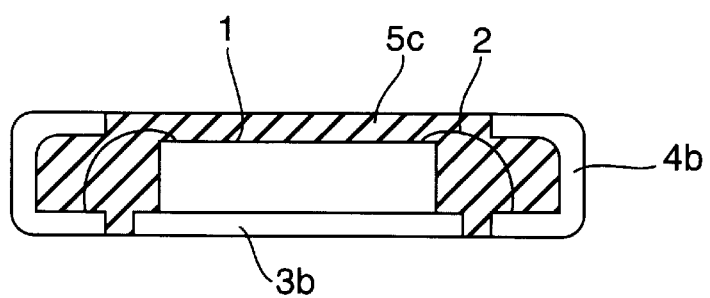
FIG. 6 is a sectional view of a semiconductor device according to a second preferred embodiment of the present invention.

FIG. 6 is a sectional view of a semiconductor device according to a second preferred embodiment of the present invention. In FIG. 6, 5c denotes molded resin which is a body of the IC package, and other reference characters correspond to the reference characters in FIG. 1.

Next, the structure of the semiconductor device according to the second preferred embodiment will be described. The portions of the external leads 4b on the surface side of the molded resin 5c (the upper side in the figure) are formed in the same plane as the surface of the molded resin 5c. The structure is the same as that of the semiconductor device of the first preferred embodiment in other respects. A semiconductor device according to this embodiment is connected to the surface side of the molded resin 5c of the semiconductor device of FIG. 6 with a connecting material such as solder, or the like, as shown in the eighth preferred embodiment discussed later, for example.

In addition to the above effects (1) to (3), the semiconductor device of this preferred embodiment provides the effect of preventing lead curving (curving of the external leads 4b in the outward direction of the mold resin 5c) and allows application of the common screen printing method when supplying the connecting material, such as solder, because the parts of the external leads 4b that are formed on the surface side of the mold resin 5c are in the same plane as the surface of the molded resin 5c.

Third Preferred Embodiment

Figure 7:
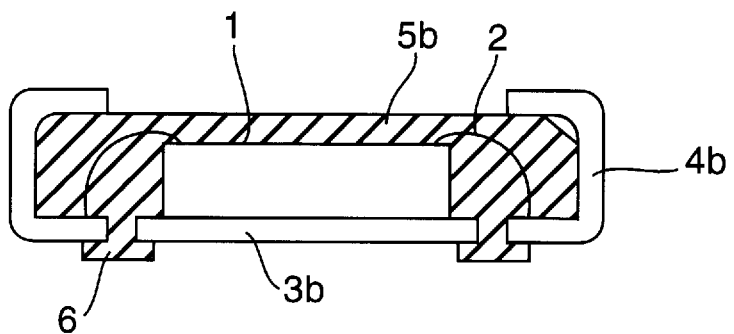
FIG. 7 is a sectional view of a semiconductor device according to a third preferred embodiment of the present invention.

FIG. 7 is a sectional view of a semiconductor device according to a third preferred embodiment of the present invention. In FIG. 7, 6 denotes a molded resin protecting the external leads 4b on the exposed surface side of the die pad 3b, except in the parts connected to an external substrate (not shown), or the like, and other characters correspond to those in FIG. 1.

Next, the structure of the semiconductor device in this preferred embodiment will be described. The external leads 4b are covered with the molded resin 6, except in the connections with an external substrate or the like (not shown). The structure is the same as that of the semiconductor device of the first preferred embodiment in other respects. Particularly, the semiconductor device shown in FIG. 7 shows the case in which, in the external leads 4b except in the connections to an external substrate or the like, the gap between the external leads 4b on the exposed surface side of the die pad 3b and the die pad 3b is covered with the molded resin 6.

The semiconductor device of this preferred embodiment in which the molded resin 6 covers the external leads 4b except in the connection parts to an external substrate or the like provides the effect of preventing the connecting material, such as solder, used to connect the external substrate and the external leads 4b from flowing into the gap between the die pad 3b and the external leads 4b, in addition to the effects of (1) to (3).

Fourth Preferred Embodiment

Figure 8:
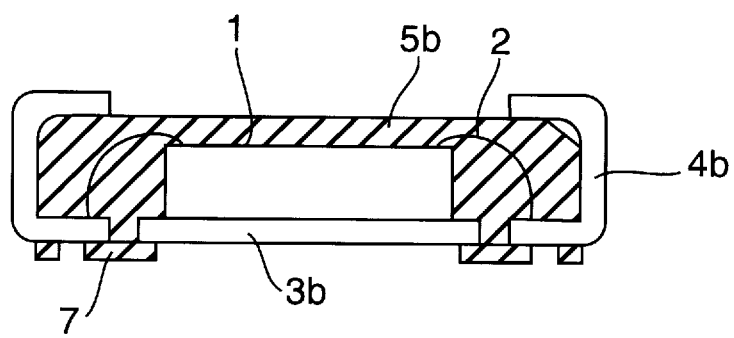
FIG. 8 is a sectional view of a semiconductor device according to a fourth preferred embodiment of the present invention.

FIG. 8 is a sectional view of a semiconductor device according to a third preferred embodiment of the present invention. In FIG. 8, 7 denotes a solder resist serving as a protecting material covering the portions of the external leads 4b on the exposed surface side of the die pad 3b, except the connections to an external substrate or the like (not shown), and other characters correspond to those in FIG. 1.

Next, the structure of the semiconductor device in this preferred embodiment will be explained. The solder resist 7 covers the external leads 4b, except in their connections with an external substrate, or the like (not shown). Its structure is the same as that of the semiconductor device of the first preferred embodiment in other respects. The semiconductor device shown in FIG. 8 particularly shows the case in which the solder resist 7 covers the gap between the external leads 4b on the exposed surface side of the die pad 3b and the die pad 3b in the external leads 4b except the connections to the external substrate or the like.

The semiconductor device of this preferred embodiment in which the external leads 4b are covered with the solder resist 7 except in the connections to an external substrate or the like provides, as well as the effects (1) to (3), the effect of preventing the connecting material such as solder used to connect an external substrate or the like and the external leads 4b from flowing into the gap between the die pad 3b and the external leads 4b.

Fifth Preferred Embodiment

Figure 9:
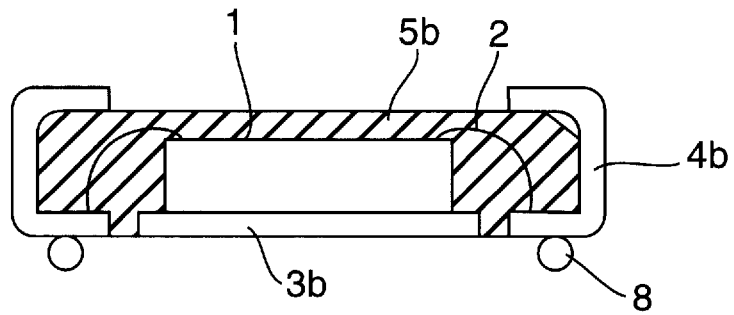
FIG. 9 is a sectional view of a semiconductor device according to a fifth preferred embodiment of the present invention.

FIG. 9 is a sectional view of a semiconductor device according to a fifth preferred embodiment of the present invention. In FIG. 9, 8 denotes a solder ball which is a connecting material for connection with an external substrate or the like (not shown), and other characters correspond to those in FIG. 1.

Next, the structure of the semiconductor device in this preferred embodiment will be discussed. In its structure, the solder balls 8 are formed in the connections of the external leads 4b to an external substrate, or the like. The structure is the same as that of the semiconductor device of the first preferred embodiment in other respects. Particularly, the solder balls of the semiconductor device shown in FIG. 9 are formed on the external leads 4b on the exposed surface side of the die pad 3b.

In addition to the above-explained effects (1) to (3), the semiconductor device of this preferred embodiment provides the effect of allowing connection with an external substrate or the like without requiring supplying of solder when mounting because the solder balls 8 for connection to an external substrate or the like are disposed on the external leads 4b.

Sixth Preferred Embodiment

Figure 10A:
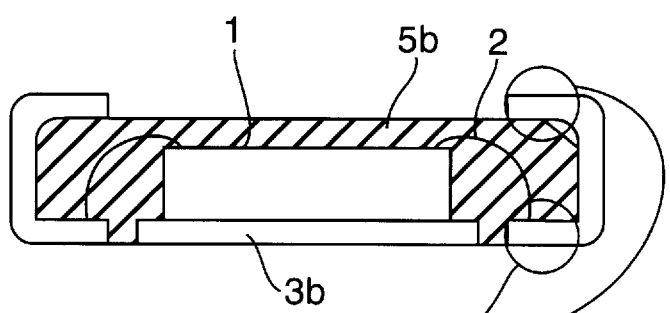
Figure 10B:
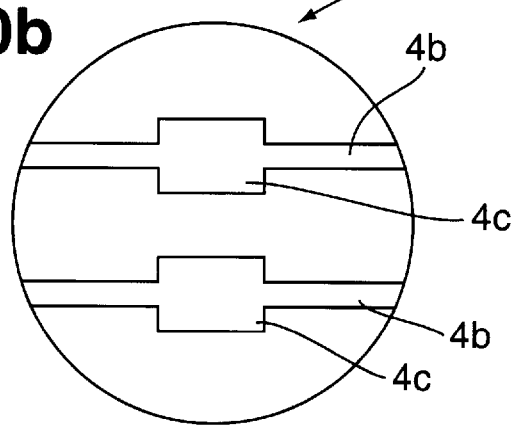

FIG. 10(b) is an enlarged view of the external leads 4b of a semiconductor device according to a sixth preferred embodiment of the present invention, shown in FIG. 10(a). In FIG. 10(b) 4c denotes a enlarged portion for external connection to a substrate or the like in the lead 4b, and other characters correspond to those in FIG. 1.

Next, the structure of the semiconductor device in this preferred embodiment will be described. The external connection part of the external lead 4b has the enlarged portion 4c. The structure is the same as that of the semiconductor device of the first preferred embodiment in other respects. The external leads 4b of the semiconductor device shown in FIG. 10(b) particularly have the enlarged portions 4c in the connections to an external substrate or the like on the surface side of the molded resin 5b (the upper side in the figure) and the exposed surface side of the die pad 3b.

In addition to the effects (1) to (3), the semiconductor device of this preferred embodiment provides the effect (4) of absorbing shifting of the semiconductor device in mounting and obtaining a sufficient connection with solder during mounting because the external leads 4b have the enlarged portions 4c in their external connections.

Seventh Preferred Embodiment

Figure 11A:
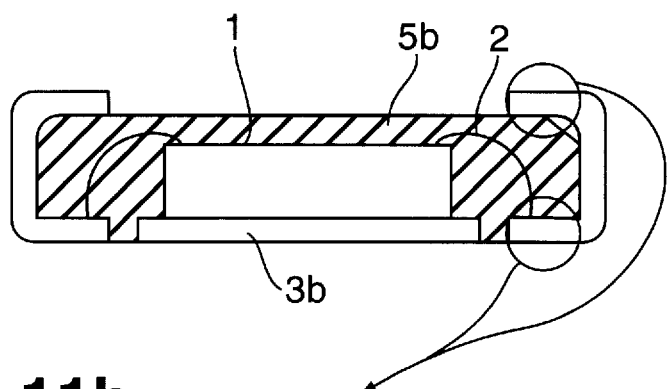
Figure 11B:
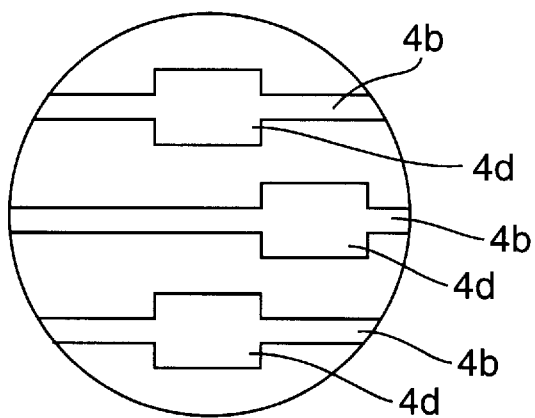

FIG. 11(b) is an enlarged view of external leads 4b of a semiconductor device according to a seventh preferred embodiment of the present invention, as shown in FIG. 11(a). In FIG. 11(b) 4d denotes a enlarged portion formed in the connection of the external lead 4b to an external substrate or the like and other characters correspond to those in FIG. 1.

Next, the structure of the semiconductor device in this preferred embodiment will be described. The external leads 4b have enlarged portions 4d for their external connections, the enlarged portions 4d of adjacent ones of the external leads 4b being alternated in a staggered arrangement. Its structure is the same as that of the semiconductor device of the first preferred embodiment in other respects. Particularly, the external leads 4b of the semiconductor device shown in FIG. 11(b) have enlarged portions 4d staggered for connection to an external substrate or the like on the surface side of the molded resin 5b (the upper side in the figure) and the exposed surface side of the die pad 3b.

According to the semiconductor device of this preferred embodiment, in addition to the effects (1) to (3) and (4), the staggered arrangement of the enlarged portions 4d of adjacent external leads 4b enlarges the distance between the enlarged portion 4d of one external lead 4b and the other external lead 4b, which remedies bridging of the connecting material such as solder.

Eighth Preferred Embodiment

Figure 12:
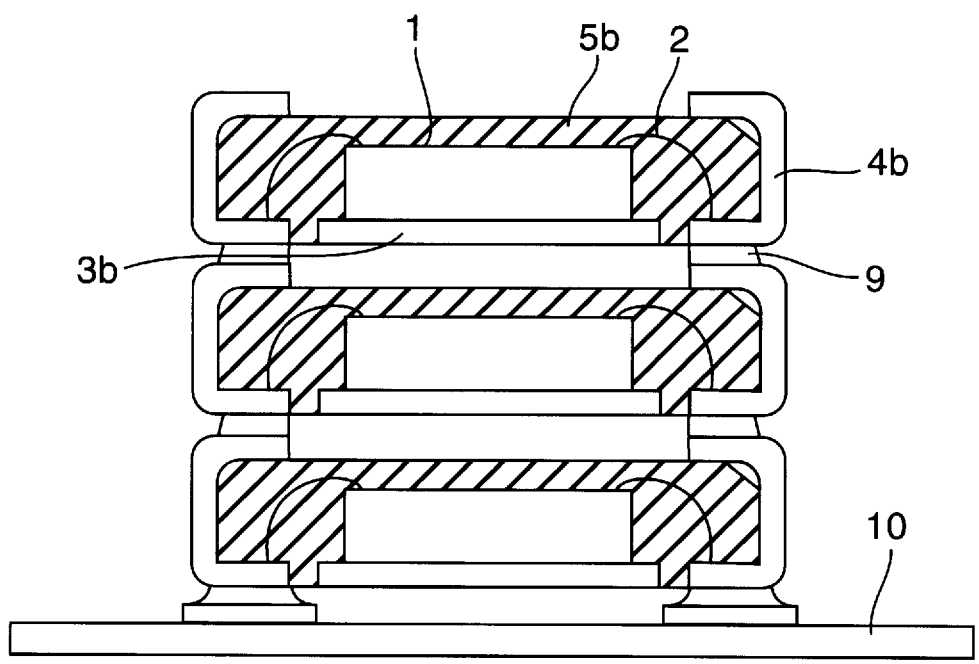
FIG. 12 is a sectional view showing semiconductor devices stacked in multiple layers according to an eighth preferred embodiment of the present invention.

FIG. 12 is a sectional view showing a semiconductor device according to an eighth preferred embodiment of the present invention, which shows the semiconductor devices of FIG. 1 stacked in multiple layers and mounted on a substrate. In FIG. 12, 9 denotes solder electrically and physically connecting the stacked semiconductor devices, 10 denotes an external substrate, and other characters correspond to those in FIG. 1.

Next, the structure of the semiconductor device in this preferred embodiment will be discussed. As shown in FIG. 12, the structure has a plurality of semiconductor devices of FIG. 1 vertically stacked in multiple layers with their respective external leads 4b physically and electrically connected with the solder 9. In place of the semiconductor devices of FIG. 1, the semiconductor devices of FIG. 6 to FIG. 11a may be stacked together. Some of the semiconductor devices of FIG. 1, FIG. 6 to FIG. 11a may be combined and formed into the stacked structure.

According to the semiconductor device of this preferred embodiment, stacking the semiconductor devices allows smaller packaging area and larger capacity.

Ninth Preferred Embodiment

Figure 13:
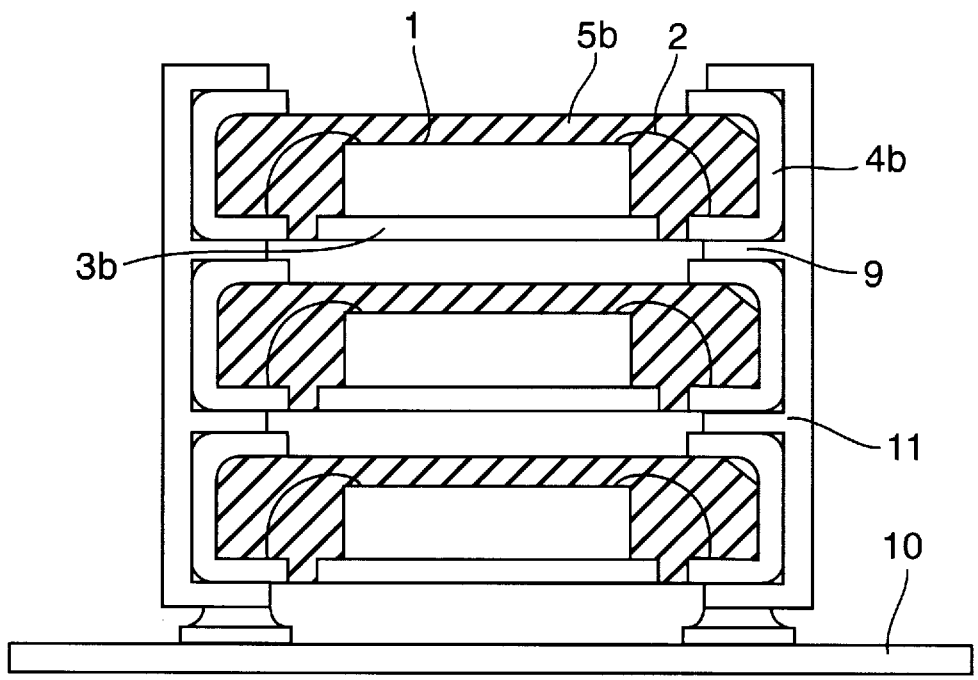
FIG. 13 is a sectional view showing semiconductor devices stacked in multiple layers according to a ninth preferred embodiment of the present invention.

FIG. 13 is a sectional view showing a semiconductor device according to a ninth preferred embodiment of the present invention, which shows the semiconductor devices of FIG. 1 vertically stacked and mounted on the substrate. In FIG. 13, 10 denotes a substrate, 11 denotes a lead frame for connecting the semiconductor devices and other characters correspond to those in FIG. 1.

Next, the structure of the semiconductor device of FIG. 13 will be described. As shown in FIG. 13, the plurality of semiconductor devices of FIG. 1 are vertically stacked in multiple layers with their respective external leads 4b physically and electrically connected with the lead frame 11. The semiconductor devices of FIG. 6 to FIG. 11 may be stacked into layers in place of the semiconductor devices of FIG. 1. Some of the semiconductor devices of FIG. 1, FIG. 6 to FIG. 11 may be stacked together in combination.

According to the semiconductor device of this preferred embodiment, the stacked structure reduces the packaging area and allows larger capacity. Furthermore, connecting them with the lead frame 11 suppresses positional shift of the semiconductor devices when stacked.

Figure 14:
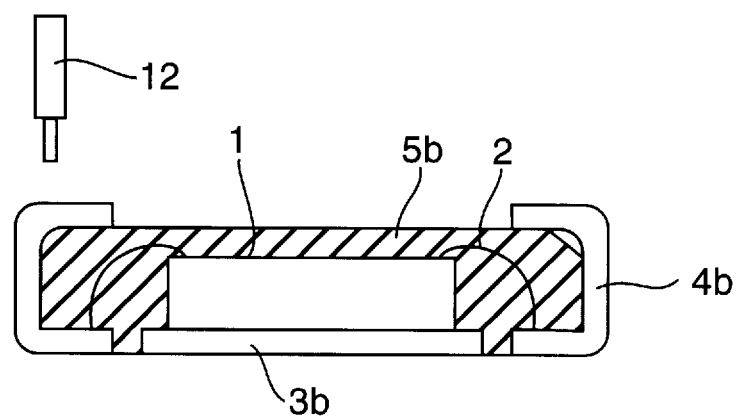
FIG. 14 is a diagram showing a method of supplying solder by the dispenser method to the semiconductor devices mounted on top of each other according to the present invention.
Figure 15:
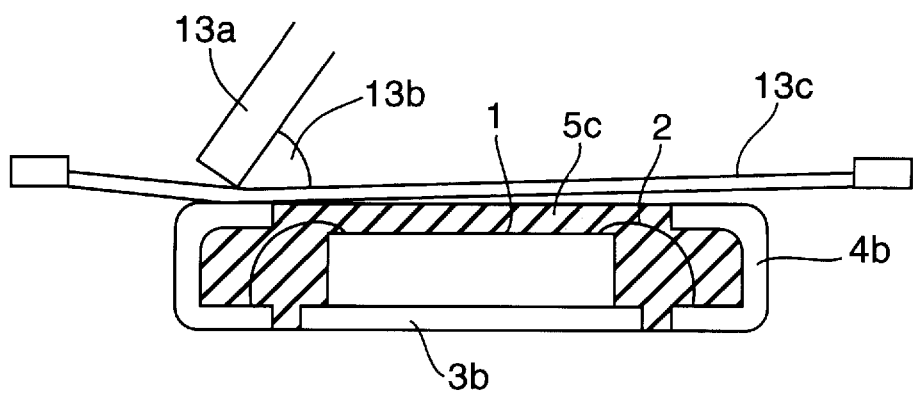
FIG. 15 is a diagram showing a method of supplying solder by the screen printing method to the semiconductor devices mounted on top of each other according to the present invention.
Figure 16:
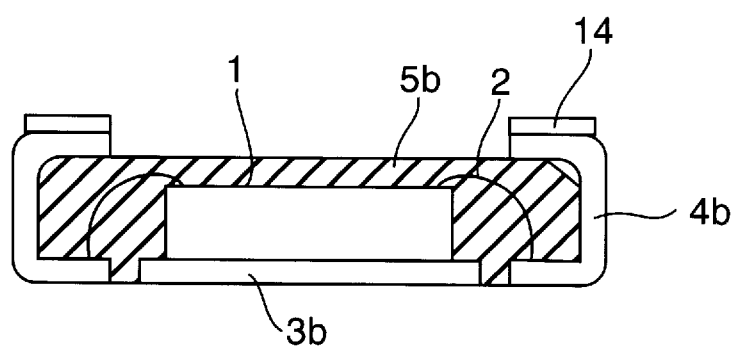
FIG. 16 is a diagram showing a method of supplying solder by the plating method to the semiconductor devices mounted on top of each other according to the present invention.

Methods of supplying solder for making connection in the case where the semiconductor devices of the present invention are stacked into multiple layers include the dispenser method using the dispenser 12 for supplying solder as shown in FIG. 14, the screen printing method of supplying the solder 13b through the mask 13c using the squeegee 13a as shown in FIG. 15, and the plating method of forming the coating 14 of solder on connections to the outside as shown in FIG. 16.

Figure 17:
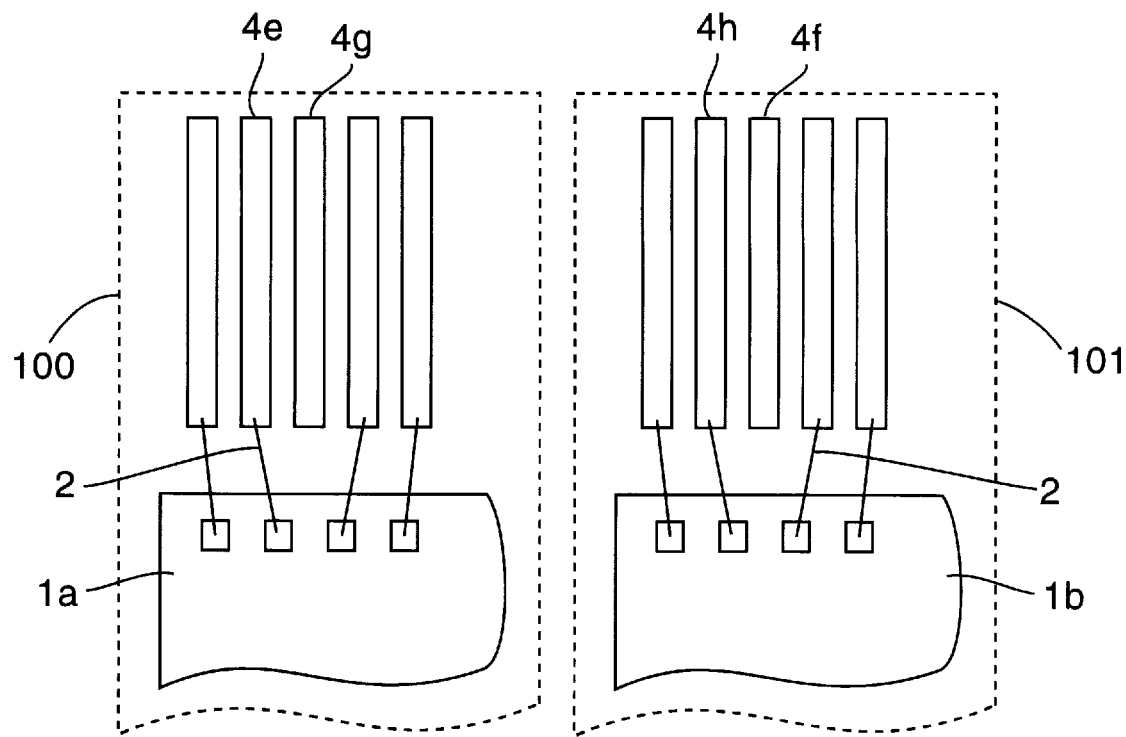
FIG. 17 is a plan for describing the dummy leads of the semiconductor device of the present invention.
Figure 18:
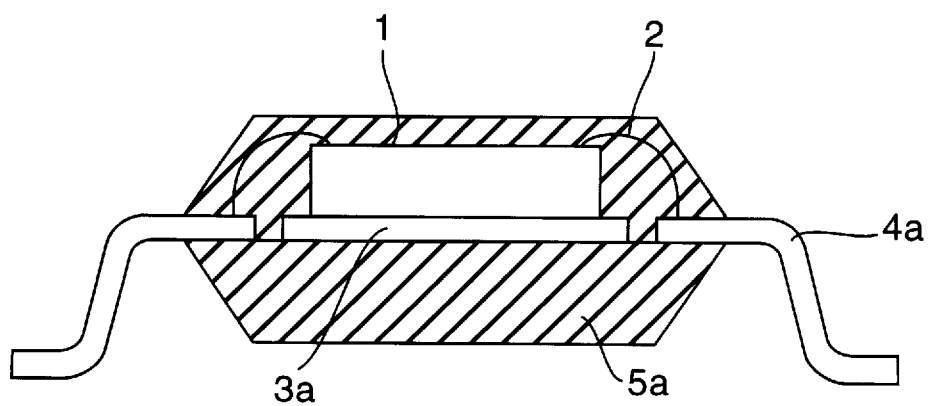
FIG. 18 is a sectional view of a conventional semiconductor device.

When the semiconductor devices are placed on top of each other as shown in the eighth and ninth preferred embodiments, external leads disposed in the physically same position are physically and electrically connected. However, some external leads must not be electrically connected. (Such external leads are shown as 4e, 4f.) FIG. 17 shows a modification of the semiconductor devices of the first through seventh preferred embodiments for solving such a problem. FIG. 17 is a view seen from the surface of the mold resin not shown, where the semiconductor devices 100 and 101 correspond to any of the semiconductor devices of the first through seventh preferred embodiments. The dummy lead (dummy terminal) 4g of the semiconductor device 100 is shaped almost the same as the external lead 4b described in the first through seventh preferred embodiments, but it is not electrically connected to the IC chip 1a. The same is true for the dummy lead (dummy terminal) 4h of the semiconductor device 101. When the semiconductor device 100 and the semiconductor device 101 are placed on top of the other with the surface of the semiconductor device 100 and the back of the semiconductor device 101 facing each other, the dummy lead 4g and the external lead 4f, and the external lead 4e and the dummy lead 4h are physically connected, respectively. Accordingly, the external leads 4e and 4f are not connected electrically.

While the invention has been described in detail, the foregoing description is in all aspects illustrative and not restrictive. It is understood that numerous other modifications and variations can be devised without departing from the scope of the invention.

I claim:

1. A semiconductor device comprising:
   a semiconductor integrated circuit chip;
   a connection plate having a first main surface on which said semiconductor integrated circuit chip is mounted and a second main surface opposite the first main surface;
   a semiconductor device package body having side surfaces transverse to the second main surface and a first surface directly opposite the first main surface of said connecting plate, encapsulating said semiconductor integrated circuit and covering said first main surface of said connection plate not covered by said integrated circuit chip, wherein the second main surface of said connection plate is exposed from said package body; and an external terminal electrically connected to said integrated circuit chip, partially coplanar with said connection plate, contacting a side surface of said package body, and extending to and contacting the first surface of said package body.

2. The semiconductor device according to claim 1 wherein said package body extends at the first surface so that said external terminal at the first surface of said package body is coplanar with a surface of said package body.

3. The semiconductor device according to claim 1 wherein said external terminal is spaced from said connecting plate at the second main surface by a gap and comprising a protecting material covering the gaps and part of said external terminal and connection plate at the second main surface.

4. The semiconductor device according to claim 1 comprising an electrically conducting connecting material for electrically connecting said external terminal to an external element and disposed on said external terminal.

5. The semiconductor device according to claim 1 wherein said external terminal has a widened connection portion.

6. The semiconductor device according to claim 1 including a plurality of side-by-side external terminals, each of said external terminals having a widened portion, respective widened portions of neighboring side-by-side external terminals being staggered.

7. The semiconductor device according to claim 1, further comprising a dummy terminal not electrically connected to said semiconductor integrated circuit chip.

8. A semiconductor device structure comprising:

a plurality of semiconductor devices, each semiconductor device including:
  a semiconductor integrated circuit chip;
  a connection plate having a first main surface on which said semiconductor integrated circuit chip is mounted and a second main surface opposite the first main surface;
  a semiconductor device package body having side surfaces transverse to the second main surface and a first surface directly opposite the first main surface of said connecting plate and encapsulating said semiconductor integrated circuit and covering said first main surface of said connection plate not covered by said integrated circuit chip, wherein the second main surface of said connection plate is exposed from said package body; and
  an external terminal electrically connected to said integrated circuit chip, partially coplanar with said connection plate, contacting a respective side surface of said package body, and extending to and contacting the first surface of said package body, wherein said plurality of semiconductor devices are stacked with respective external terminals of adjacent semiconductor devices electrically connected together.

9. The semiconductor device according to claim 8 comprising a frame disposed partially between adjacent pairs of said plurality of semiconductor devices, electrically connecting respective external terminals of said plurality of semiconductor devices together.

* * * * *